United States Patent [19]

Carle et al.

[11] Patent Number: 4,939,928

[45] Date of Patent: Jul. 10, 1990

[54] METHOD OF DETERMINING THE CONTINUITY OF SOLENOIDS IN AN ELECTRONIC AUTOMATIC TRANSMISSION SYSTEM

[75] Inventors: Keith B. Carle, Hartland; Thomas Glowczewski, Washington Township, Macomb County; Gerald L. Holbrook, Rochester Hills; William R. Kissel, Milford; Maurice B. Leising, Clawson; Michael R. Lindsay, Livonia, all of Mich.

[73] Assignee: Chrysler Corporation, Highland Park, Mich.

[21] Appl. No.: 366,361

[22] Filed: Jun. 15, 1989

Related U.S. Application Data

[63] Continuation of Ser. No. 188,607, Apr. 29, 1988, abandoned.

[51] Int. Cl.⁵ .......................................... G01M 19/00
[52] U.S. Cl. .................................................. 73/118.1
[58] Field of Search ...................... 73/118.1; 364/550; 324/546

[56] References Cited

U.S. PATENT DOCUMENTS

| | | |
|---|---|---|
| 3,631,744 | 1/1972 | Blomqvist et al. ............ 74/868 |
| 3,876,028 | 4/1975 | Asano et al. |
| 3,881,368 | 5/1975 | Furuhashi et al. |
| 3,882,740 | 5/1975 | Forster et al. |
| 3,895,541 | 7/1975 | Nohira et al. |
| 3,942,393 | 3/1976 | Forster et al. |
| 3,956,947 | 5/1976 | Leising et al. ............ 74/866 |
| 4,030,380 | 6/1977 | Mutter . |
| 4,044,634 | 8/1977 | Florus et al. |
| 4,073,204 | 2/1978 | Dick . |
| 4,082,013 | 4/1978 | Dornfeld et al. |
| 4,131,036 | 12/1978 | Ivey et al. |
| 4,148,230 | 4/1979 | Kodama et al. |
| 4,174,645 | 11/1979 | Ohmae et al. |
| 4,208,925 | 6/1980 | Miller et al. |
| 4,220,058 | 9/1980 | Petzold . |
| 4,224,842 | 9/1980 | Rabus et al. |
| 4,244,244 | 1/1981 | Rembold et al. |
| 4,258,591 | 3/1981 | Eckert et al. |
| 4,259,882 | 4/1981 | Miller . |
| 4,283,970 | 8/1981 | Vukovich . |
| 4,285,252 | 8/1981 | Yamaki et al. |
| 4,289,048 | 9/1981 | Mikel et al. ............ 74/733 |
| 4,290,322 | 9/1981 | Huitema . |
| 4,338,966 | 7/1982 | Smith ............ 137/596.17 |
| 4,345,489 | 8/1982 | Muller et al. |
| 4,368,649 | 1/1983 | Vahratian et al. |
| 4,380,048 | 4/1983 | Kishi et al. |
| 4,414,863 | 11/1983 | Heino ............ 74/731 |
| 4,452,099 | 6/1984 | Croswhite . |
| 4,456,107 | 6/1984 | Ito et al. |
| 4,468,988 | 9/1984 | Hiramatsu . |
| 4,468,989 | 9/1984 | Rosen . |
| 4,485,443 | 11/1984 | Knodler et al. |
| 4,503,734 | 3/1985 | Acker . |

(List continued on next page.)

OTHER PUBLICATIONS

Miesterfeld, "Chrysler Collision Detection (C²D)—A Revolutionary Vehicle Network", SAE Technical Paper Series, Feb. 24–28, 1986.

Terman et al., "Electronics Measurements", 2nd edition, McGraw Hill Book Co., Inc., 1952, pp. 574–575.

Takeo Hiramatsu, et al., "Control Technology of Minimal Slip-Type Torque Converter Clutch, " SAE Technical Paper 850460 (1985).

M. Suga, et al., "The Control of the Lockup Clutch Used in the Microprocessor Controlled Automatic Transmission", 1 Mech. E. (1985).

Primary Examiner—Robert R. Raevis
Attorney, Agent, or Firm—Mark P. Calcaterra

[57] ABSTRACT

A method of determining the continuity of solenoids in an electronic automatic transmission system wherein a controller is programmed to determine solenoid continuity by checking for the presence of an inductive "OFF" spike which results from an open circuit or a direct short to supply voltage from the solenoid of the solenoid-actuated valves.

16 Claims, 6 Drawing Sheets

U.S. PATENT DOCUMENTS

| | | | |
|---|---|---|---|
| 4,523,281 | 6/1985 | Noda et al. | 192/3.54 |
| 4,527,448 | 7/1985 | Person et al. | |
| 4,527,678 | 7/1985 | Pierce et al. | |
| 4,535,412 | 8/1985 | Cederquist. | |
| 4,541,308 | 9/1985 | Person et al. | |
| 4,560,047 | 12/1985 | McCarthy et al. | |
| 4,584,906 | 4/1986 | Nagaoka et al. | |
| 4,586,401 | 5/1986 | Nogle. | |
| 4,602,603 | 7/1986 | Honkanen et al. | 123/416 |
| 4,631,628 | 12/1986 | Kissel | 361/154 |
| 4,637,281 | 1/1987 | Vanselous. | |
| 4,637,361 | 1/1987 | Killen et al. | 123/339 |
| 4,638,720 | 1/1987 | McKee et al. | 91/522 |
| 4,658,929 | 4/1987 | Katou et al. | |
| 4,660,672 | 4/1987 | Katou. | |
| 4,667,540 | 5/1987 | Yagi. | |
| 4,680,988 | 7/1987 | Mori. | |
| 4,693,142 | 9/1987 | Kurihara et al. | |
| 4,698,764 | 10/1987 | Inagaki et al. | 74/866 |
| 4,706,082 | 11/1987 | Meisterfeld et al. | 340/825.5 |
| 4,706,561 | 11/1987 | Greer | 324/73 R |
| 4,707,789 | 11/1987 | Downs et al. | |
| 4,711,138 | 12/1987 | Miura et al. | |
| 4,719,458 | 1/1988 | Miesterfeld et al. | 340/825.5 |
| 4,724,723 | 2/1988 | Lockhart et al. | |
| 4,734,861 | 3/1988 | Bertolasi et al. | 364/569 |
| 4,739,323 | 4/1988 | Miesterfeld et al. | 340/825.5 |
| 4,739,324 | 4/1988 | Miesterfeld et al. | 340/825.5 |

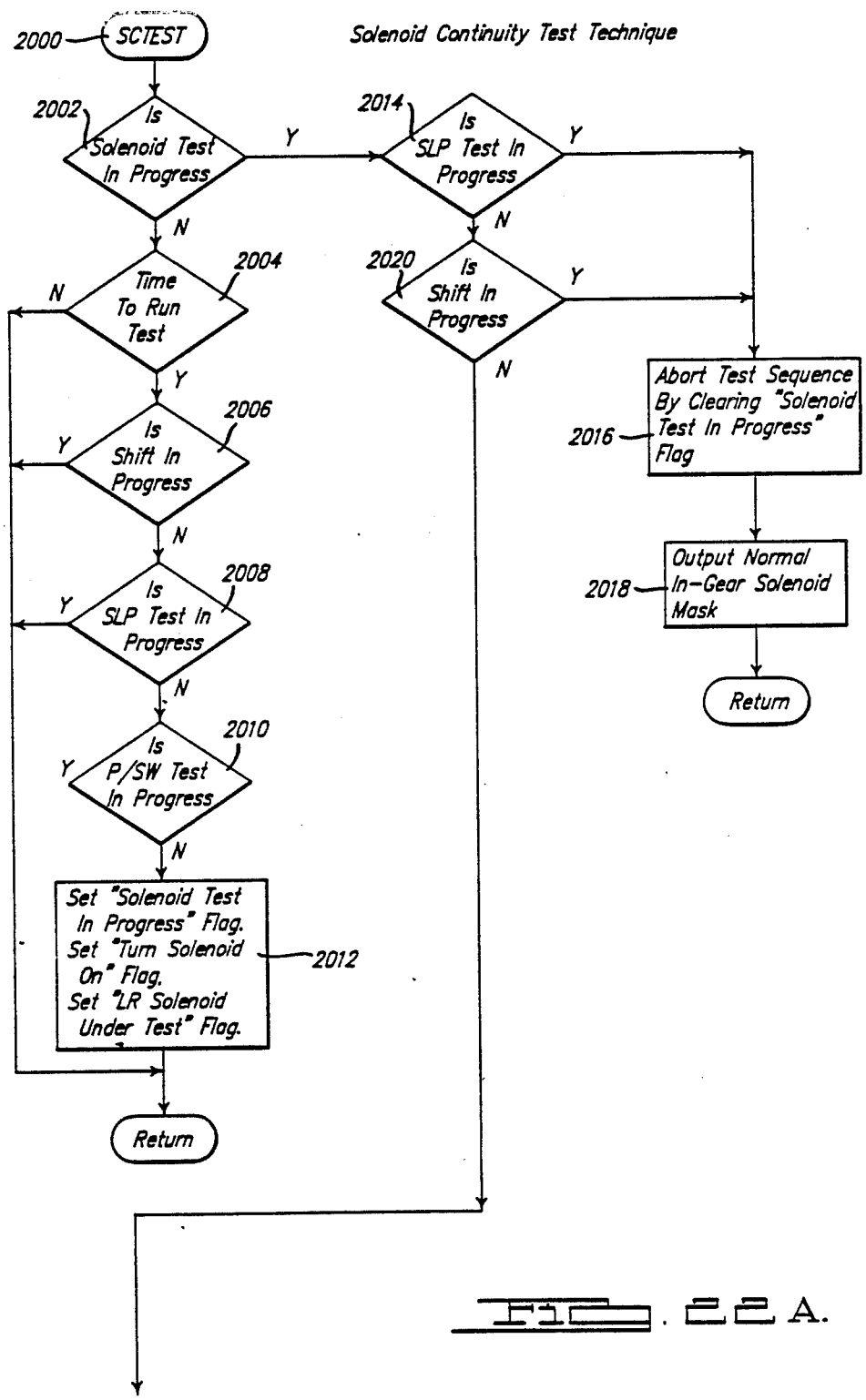

METHOD OF DETERMINING THE CONTINUITY OF SOLENOIDS IN AN ELECTRONIC AUTOMATIC TRANSMISSION SYSTEM

Continuation of U.S. Ser. No. 188,607 filed on Apr. 29, 1988, now abandoned.

The following documents incorporated by reference into the parent application U.S. Ser. No. 188,607 are hereby specifically and expressly incorporated by reference into this continuation application:

U.S. Pat. Nos.

3,631,744
4,289,048
3,956,947
4,338,966
4,637,361
4,612,638
4,706,082
4,719,458
4,739,323
4,739,324
4,742,349
4,602,603
4,631,628

SAE 860389 entitled "Chrysler Collision Detection (C/D)—A Revolutionary Network," by Frederick O. R. Miesterfield, 1986.

BACKGROUND OF THE INVENTION

1. Field of the Invention

The present invention relates to an automatic transmission primarily intended for motor vehicle use, and more particularly, to a method of determining the continuity of solenoids in solenoid-actuated valves of a transmission that is controlled electronically and hydraulically.

2. Description of Related Art

Generally speaking, land vehicles require three basic components. These components comprise a power plant (such as an internal combustion engine) a power train and wheels. The internal combustion engine produces force by the conversion of the chemical energy in a liquid fuel into the mechanical energy of motion (kinetic energy). The function of the power train is to transmit this resultant force to the wheels to provide movement of the vehicle.

The power train's main component is typically referred to as the "transmission". Engine torque and speed are converted in the transmission in accordance with the tractive-power demand of the vehicle. The vehicle's transmission is also capable of controlling the direction of rotation being applied to the wheels, so that the vehicle may be driven both forward and backward.

A conventional transmission includes a hydrodynamic torque converter to transfer engine torque from the engine crankshaft to a rotatable input member of the transmission through fluid-flow forces. The transmission also includes frictional units which couple the rotating input member to one or more members of a planetary gearset. Other frictional units, typically referred to as brakes, hold members of the planetary gearset stationary during flow of power. These frictional units are usually brake clutch assemblies or band brakes. The drive clutch assemblies can couple the rotating input member of the transmission to the desired elements of the planetary gearsets, while the brakes hold elements of these gearsets stationary. Such transmission systems also typically provide for one or more planetary gearsets in order to provide various ratios of torque and to ensure that the available torque and the respective tractive power demand are matched to each other.

Transmissions are generally referred to as manually actuated or automatic transmissions. Manual transmissions generally include mechanical mechanisms for coupling rotating gears to produce different ratio outputs to the drive wheels.

Automatic transmissions are designed to take automatic control of the frictional units, gear ratio selection and gear shifting. A thorough description of general automatic transmission design principals may be found in "Fundamentals of Automatic Transmissions and Transaxles," Chrysler Corporation Training Manual No. TM-508A. Additional descriptions of automatic transmissions may be found in U.S. Pat. No. 3,631,744, entitled "Hydromatic Transmission," issued Jan. 4, 1972 to Blomquist, et al., and U.S. Pat. No. 4,289,048, entitled "Lock-up System for Torque Converter," issued on Sept. 15, 1981 to Mikel, et al. Each of these patents is hereby incorporated by reference.

In general, the major components featured in such an automatic transmission are: a torque converter as above-mentioned; fluid pressure-operated multi-plate drive or brake clutches and/or brake bands which are connected to the individual elements of the planetary gearsets in order to perform gear shifts without interrupting the tractive power; one-way clutches in conjunction with the frictional units for optimization of power shifts; and transmission controls such as valves for applying and releasing elements to shift the gears (instant of shifting), for enabling power shifting, and for choosing the proper gear (shift point control), dependent on shift-program selection by the driver (selector lever), accelerator position, the engine condition and vehicle speed.

The control system of the automatic transmission is typically hydraulically operated through the use of several valves to direct and regulate the supply of pressure. This hydraulic pressure control will cause either the actuation or deactuation of the respective frictional units for effecting gear changes in the transmission. The valves used in the hydraulic control circuit typically comprise spring-biased spool valves, spring-biased accumulators and ball check valves. Since many of these valves rely upon springs to provide a predetermined amount of force, it will be appreciated that each transmission design represents a finely tuned arrangement of interdependent valve components. While this type of transmission control system has worked well over the years, it does have its limitations. For example, such hydraulically controlled transmissions are generally limited to one or a very small number of engines and vehicle designs. Therefore, considerable cost is incurred by an automobile manufacturer to design, test, build, inventory and repair several different transmission units in order to provide an acceptable broad model line for consumers.

Additionally, it should be appreciated that such hydraulically controlled transmission systems cannot readily adjust themselves in the field to compensate for varying conditions such as normal wear on the components, temperature swings and changes in engine performance over time. While each transmission is designed to operate most efficiently within certain specific tolerances, typical hydraulic control systems are incapable of taking self-corrective action on their own to maintain operation of the transmission at peak efficiency.

However, in recent years, a more advanced form of transmission control system has been proposed, which would offer the possibility of enabling the transmission to adapt itself to changing conditions. In this regard, U.S. Pat. No. 3,956,947, issued on May 18, 1976 to Leising, et al., which is hereby incorporated by reference, sets forth a fundamental development in this field. Specifically, this patent discloses an automatic transmission design which features an "adaptive" control system that includes electrically operated solenoid-actuated valves for controlling certain fluid pressures. In accordance with this electric/hydraulic control system, the automatic transmission would be "responsive" to an acceleration factor for controlling the output torque of the transmission during a shift from one ratio of rotation (between the input and output shafts of the transmission) to another. Specifically, the operation of the solenoid-actuated valves would cause a rotational speed versus time curve of a sensed rotational component of the transmission to substantially follow along a predetermined path during shifting.

3. Objects Of the Present Invention

It is one of the principal objects of the present invention to provide a significantly advanced electronically controlled transmission which is fully adaptive. By fully adaptive, it is meant that substantially all shifts are made using closed-loop control (i.e., control based on feedback). In particular, the control is closed loop on speed, speed ratio, or slip speed of either $N_t$ (turbine of the torque converter) and $N_e$ (engine) or a combination of $N_t$ and $N_o$ (output) which will provide the speed ratio or slip speed. This transmission control is also capable of "learning" from past experience and making appropriate adjustments on that basis.

Another object of the present invention is to provide an automatic transmission in which the shift quality is maintained approximately uniform regardless of the engine size, within engine performance variations or component condition (i.e. the transmission control system will adapt to changes in engine performance or in the condition of the various frictional units of the transmission).

It is a more specific object of the present invention to provide a method of determining solenoid continuity of a plurality of solenoid-actuated valves for proper operation of the solenoid circuitry.

This application is one of several applications filed on the same date, all commonly assigned and having similar Specification and Drawings, these applications being identified below.

| U.S. Ser. No. | Title |
|---|---|
| 187,772 | AN ELECTRONICALLY-CONTROLLED, ADAPTIVE AUTOMATIC TRANSMISSION SYSTEM |
| 187,751 | AUTOMATIC FOUR-SPEED TRANSMISSION |
| 189,493 | PUSH/PULL CLUTCH APPLY PISTON OF AN AUTOMATIC TRANSMISSION |
| 187,781 | SHARED REACTION PLATES BETWEEN CLUTCH ASSEMBLIES IN AN AUTOMATIC TRANSMISSION |
| 189,492 | CLUTCH REACTION AND PRESSURE PLATES IN AN AUTOMATIC TRANSMISSION |
| 188,602 | BLEEDER BALL CHECK VALVES IN AN AUTOMATIC TRANSMISSION |
| 188,610 | PRESSURE BALANCED PISTONS IN AN AUTOMATIC TRANSMISSION |

-continued

| U.S. Ser. No. | Title |
|---|---|
| 189,492 | DOUBLE-ACTING SPRING IN AN AUTOMATIC TRANSMISSION |
| 188,613 | PARK LOCKING MECHANISM FOR AN AUTOMATIC TRANSMISSION |
| 187,770 | SOLENOID-ACTUATED VALVE ARRANGEMENT OF AN AUTOMATIC TRANSMISSION SYSTEM |
| 187,796 | RECIPROCATING VALVES IN A FLUID SYSTEM OF AN AUTOMATIC TRANSMISSION |
| 187,705 | VENT RESERVOIR IN A FLUID SYSTEM OF AN AUTOMATIC TRANSMISSION |
| 188,592 | FLUID ACTUATED SWITCH VALVE IN AN AUTOMATIC TRANSMISSION |
| 188,598 | DIRECT-ACTING, NON-CLOSE CLEARANCE SOLENOID-ACTUATED VALVES |
| 188,618 | NOISE CONTROL DEVICE FOR A SOLENOID-ACTUATED VALVE |
| 188,605 | FLUID ACTUATED PRESSURE SWITCH FOR AN AUTOMATIC TRANSMISSION |
| 187,210 | METHOD OF APPLYING REVERSE GEAR OF AN AUTOMATIC TRANSMISSION |
| 187,672 | TORQUE CONVERTER CONTROL VALVE IN A FLUID SYSTEM OF AN AUTOMATIC TRANSMISSION |
| 187,120 | CAM-CONTROLLED MANUAL VALVE IN AN AUTOMATIC TRANSMISSION |
| 187,181 | FLUID SWITCHING MANUALLY BETWEEN VALVES IN AN AUTOMATIC TRANSMISSION |
| 187,704 | METHOD OF OPERATING AN ELECTRONIC AUTOMATIC TRANSMISSION SYSTEM |
| 188,020 | METHOD OF SHIFT SELECTION IN AN ELECTRONIC AUTOMATIC TRANSMISSION SYSTEM |
| 187,991 | METHOD OF UNIVERSALLY ORGANIZING SHIFTS FOR AN ELECTRONIC AUTOMATIC TRANSMISSION SYSTEM |
| 188,603 | METHOD OF DETERMINING AND CONTROLLING THE LOCK-UP OF A TORQUE CONVERTER IN AN ELECTRONIC AUTOMATIC TRANSMISSION SYSTEM |
| 188,617 | METHOD OF ADAPTIVELY IDLING AN ELECTRONIC AUTOMATIC TRANSMISSION SYSTEM |
| 189,553 | METHOD OF DETERMINING THE DRIVER SELECTED OPERATING MODE OF AN AUTOMATIC TRANSMISSION SYSTEM |
| 188,615 | METHOD OF DETERMINING THE SHIFT LEVER POSITION OF AN ELECTRONIC AUTOMATIC TRANSMISSION SYSTEM |
| 188,837 | METHOD OF DETERMINING THE ACCELERATION OF A TURBINE IN AN AUTOMATIC TRANSMISSION |
| 187,771 | METHOD OF DETERMINING THE FLUID TEMPERATURE OF AN ELECTRONIC AUTOMATIC TRANSMISSION SYSTEM |
| 189,579 | METHOD OF DETERMINING THE THROTTLE ANGLE POSITION FOR AN ELECTRONIC AUTOMATIC TRANSMISSION SYSTEM |
| 188,604 | METHOD OF CONTROLLING THE SPEED CHANGE OF A KICKDOWN SHIFT FOR AN ELECTRONIC AUTOMATIC TRANSMISSION SYSTEM |
| 188,591 | METHOD OF CONTROLLING THE APPLY ELEMENT DURING A KICKDOWN SHIFT FOR ELECTRONIC AUTOMATIC TRANSMISSION SYSTEM |
| 188,608 | METHOD OF CALCULATING TORQUE FOR AN ELECTRONIC AUTOMATIC TRANSMISSION SYSTEM |
| 187,150 | METHOD OF LEARNING FOR ADAPTIVELY CONTROLLING AN ELECTRONIC AUTOMATIC TRANSMISSION SYSTEM |
| 188,595 | METHOD OF ACCUMULATOR CONTROL FOR A FRICTION ELEMENT IN AN ELECTRONIC AUTOMATIC TRANSMISSION SYSTEM |
| 188,599 | METHOD OF ADAPTIVELY SCHEDULING A SHIFT FOR AN ELECTRONIC AUTOMATIC TRANSMISSION SYSTEM |
| 188,601 | METHOD OF SHIFT CONTROL DURING A |

-continued

| U.S. Ser. No. | Title |
|---|---|
| | COASTDOWN SHIFT FOR AN ELECTRONIC AUTOMATIC TRANSMISSION SYSTEM |
| 188,620 | METHOD OF TORQUE PHASE SHIFT CONTROL FOR AN ELECTRONIC AUTOMATIC TRANSMISSION |
| 188,596 | METHOD OF DIAGNOSTIC PROTECTION FOR AN ELECTRONIC AUTOMATIC TRANSMISSION SYSTEM |
| 188,597 | METHOD OF STALL TORQUE MANAGEMENT FOR AN ELECTRONIC AUTOMATIC TRANSMISSION SYSTEM |
| 188,606 | METHOD OF SHIFT TORQUE MANAGEMENT FOR AN ELECTRONIC AUTOMATIC TRANSMISSION SYSTEM |
| 188,616 | ELECTRONIC CONTROLLER FOR AN AUTOMATIC TRANSMISSION |
| 188,600 | DUAL REGULATOR FOR REDUCING SYSTEM CURRENT DURING AT LEAST ONE MODE OF OPERATION |
| 188,619 | UTILIZATION OF A RESET OUTPUT OF A REGULATOR AS A SYSTEM LOW-VOLTAGE INHIBIT |
| 188,593 | THE USE OF DIODES IN AN INPUT CIRCUIT TO TAKE ADVANTAGE OF AN ACTIVE PULL-DOWN NETWORK PROVIDED IN A DUAL REGULATOR |
| 188,609 | SHUTDOWN RELAY DRIVER CIRCUIT |
| 188,614 | CIRCUIT FOR DETERMINING THE CRANK POSITION OF AN IGNITION SWITCH BY SENSING THE VOLTAGE ACROSS THE STARTER RELAY CONTROL AND HOLDING AN ELECTRONIC DEVICE IN A RESET CONDITION IN RESPONSE THERETO |
| 188,612 | THROTTLE POSITION SENSOR DATA SHARED BETWEEN CONTROLLER WITH DISSIMILAR GROUNDS |
| 188,611 | NEUTRAL START SWITCH TO SENSE SHIFT LEVER POSITION |
| 188,981 | OPEN LOOP CONTROL OF SOLENOID COIL DRIVER |

Commonly assigned application Ser. No. 187,772, filed Apr. 29, 1988, now U.S. Pat. No. 4,875,391 will be printed in its entirety. The Figures and the entire Specification of that patent are specifically incorporated by reference. For a description of the above copending applications, references made to the above mentioned U.S. Pat. No. 4,875,391.

SUMMARY OF THE INVENTION

To achieve the foregoing objects, the present invention provides a comprehensive four-speed automatic transmission system. While this transmission system particularly features a fully adaptive electronic control system, numerous other important advances are incorporated into this unique transmission system, as will be described below in detail.

The transmission control system includes a microcomputer-based controller which receives input signals indicative of engine speed, turbine speed, output speed (vehicle speed), throttle angle position, brake application, predetermined hydraulic pressure, the driver selected gear or operating condition (PRNODDL), engine coolant temperature, and/or ambient temperature. This controller generates command or control signals for causing the actuation of a plurality of solenoid-actuated valves which regulate the application and release of pressure to and from the frictional units of the transmission system. Accordingly, the controller will execute predetermined shift schedules stored in the memory of the controller through appropriate command signals to the solenoid-actuated valves and the feedback which is provided by various input signals.

Another primary feature of the present invention is to provide an adaptive system based on closed-loop control. In other words, the adaptive control system performs its functions based on real-time feedback sensor information, i.e., the system takes an action which affects the output, reads the effect, and adjusts the action continuously in real-time. This is particularly advantageous because the control actuations can be corrected as opposed to an open loop control in which signals to various elements are processed in accordance with a predetermined program.

In accordance with one aspect of the present invention, the controller is programmed to determine solenoid continuity by checking for the presence of an inductive "OFF" spike which results from the turning off of the solenoid driver. The absence of this spike indicates an open circuit or a direct short to supply voltage or ground exists from the solenoid of the solenoid-actuated valves. Finally, the controller uses a unique method to guarantee that the response of the spike monitor circuit is from the appropriate solenoid. Additionally, the controller uses one spike monitor circuit to test a plurality of solenoids.

BRIEF DESCRIPTION OF THE DRAWINGS

Other objects, features and advantages of the present invention will become more fully apparent from the following detailed description of the preferred embodiment, the appended claims and in the accompanying drawings in which:

FIGS. 22A-E illustrates the solenoid continuity test methodology according to the present invention; FIGS. 22A-D are flow charts of the solenoid continuity test methodology; and FIG. 22E is a graph of solenoid driver logic.

SOLENOID CONTINUITY TEST METHOD

Figure 22B:
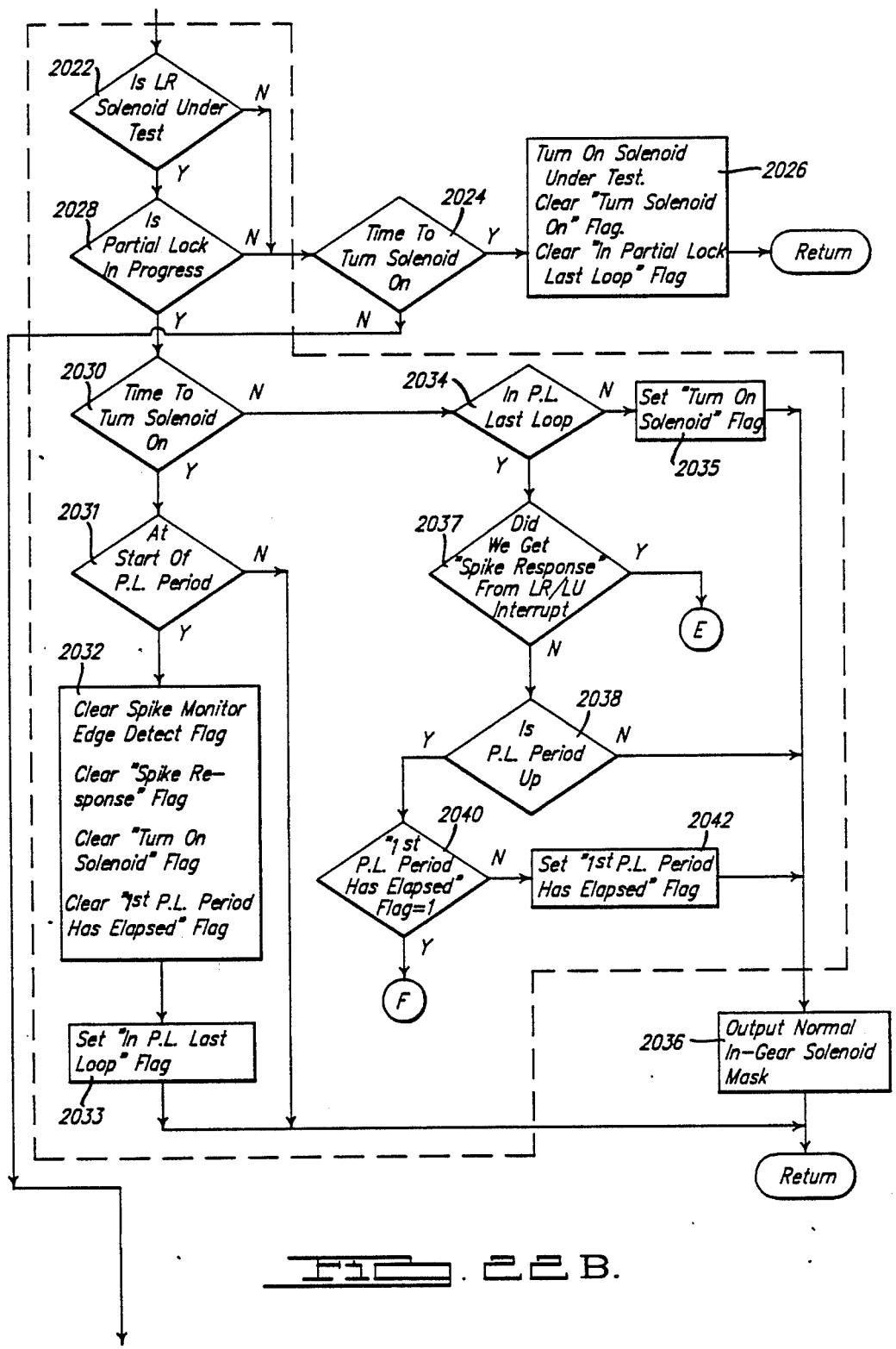
Figure 22C:
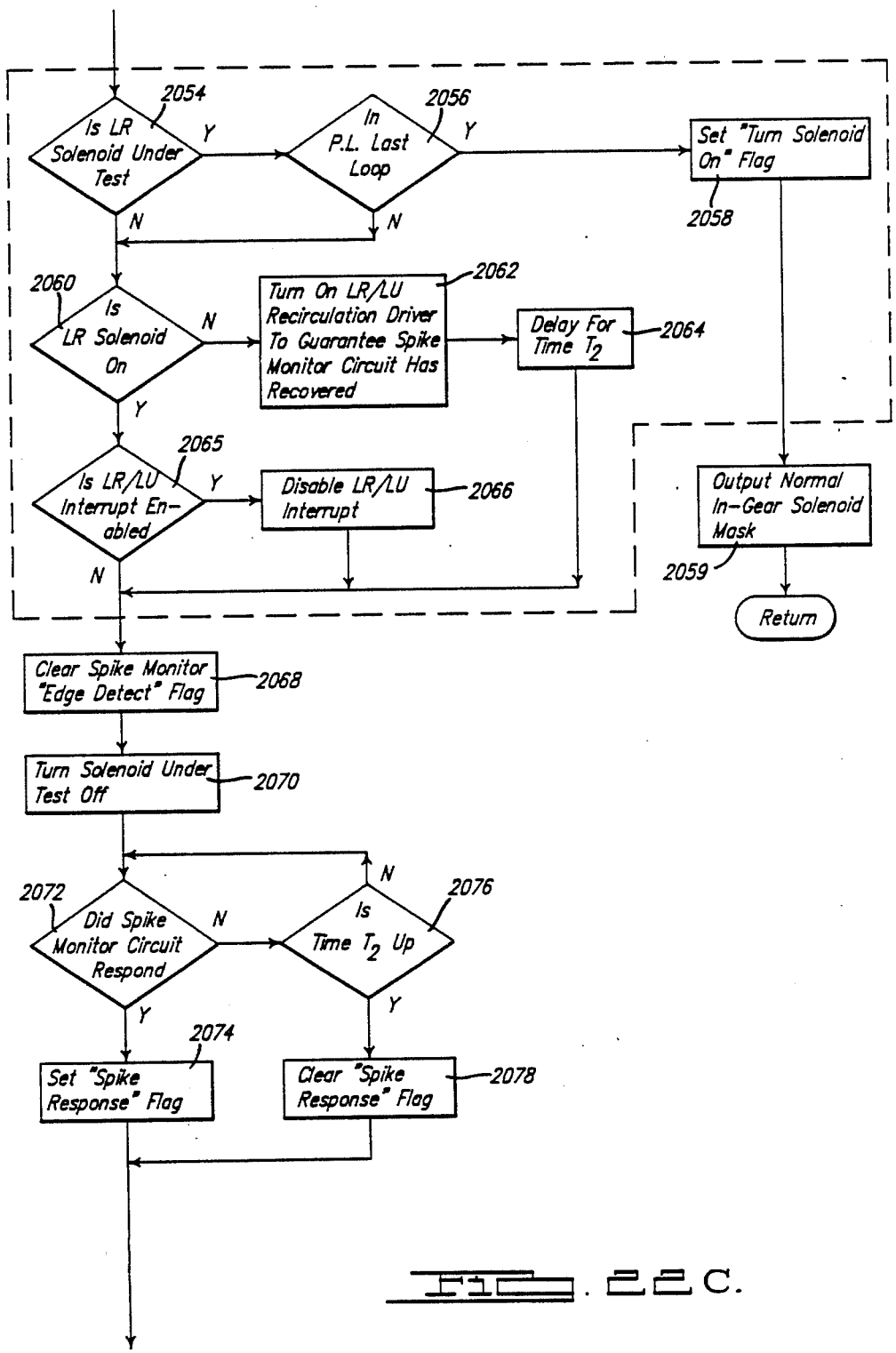
Figure 22C:
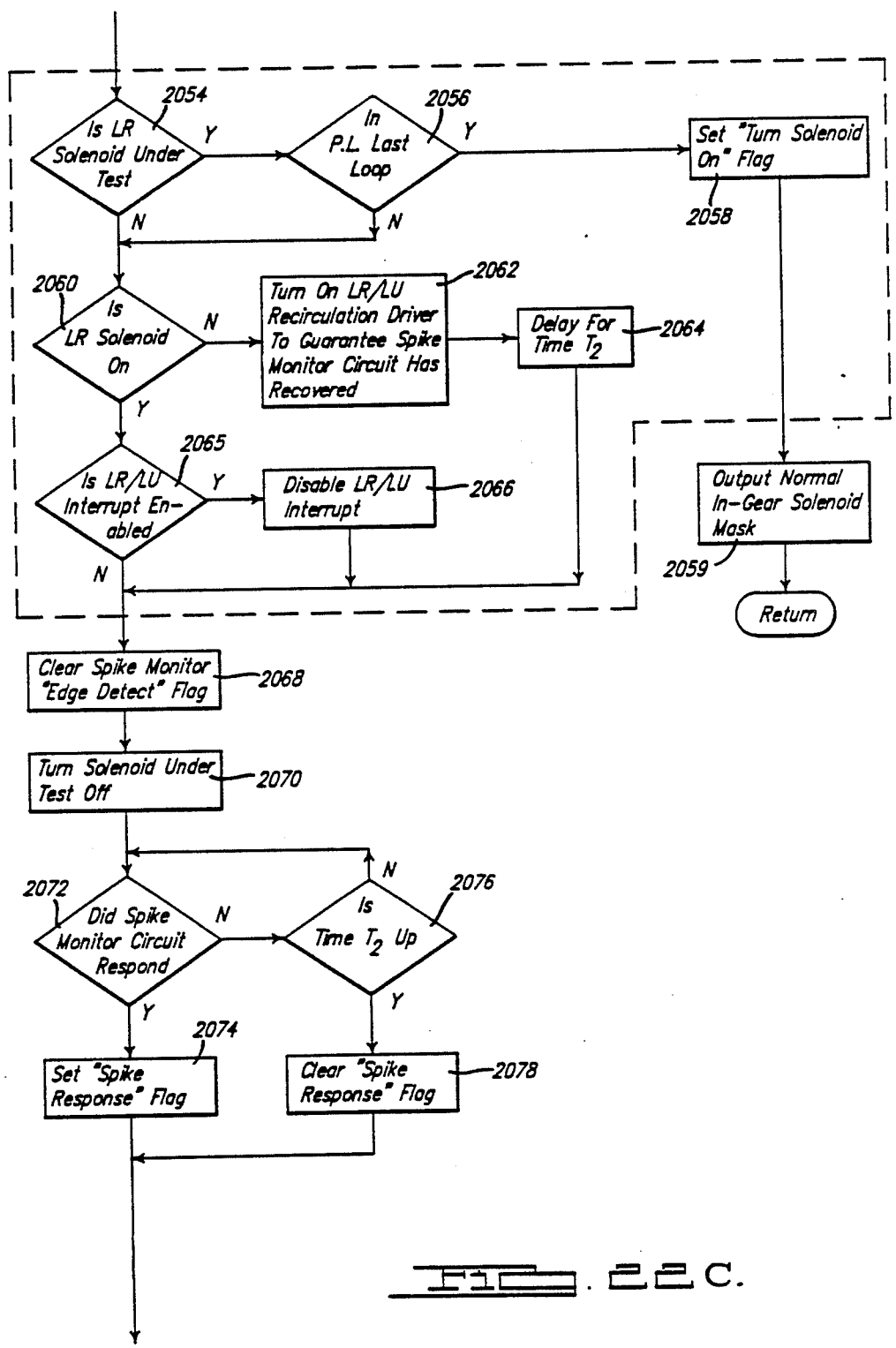
Figure 22D:
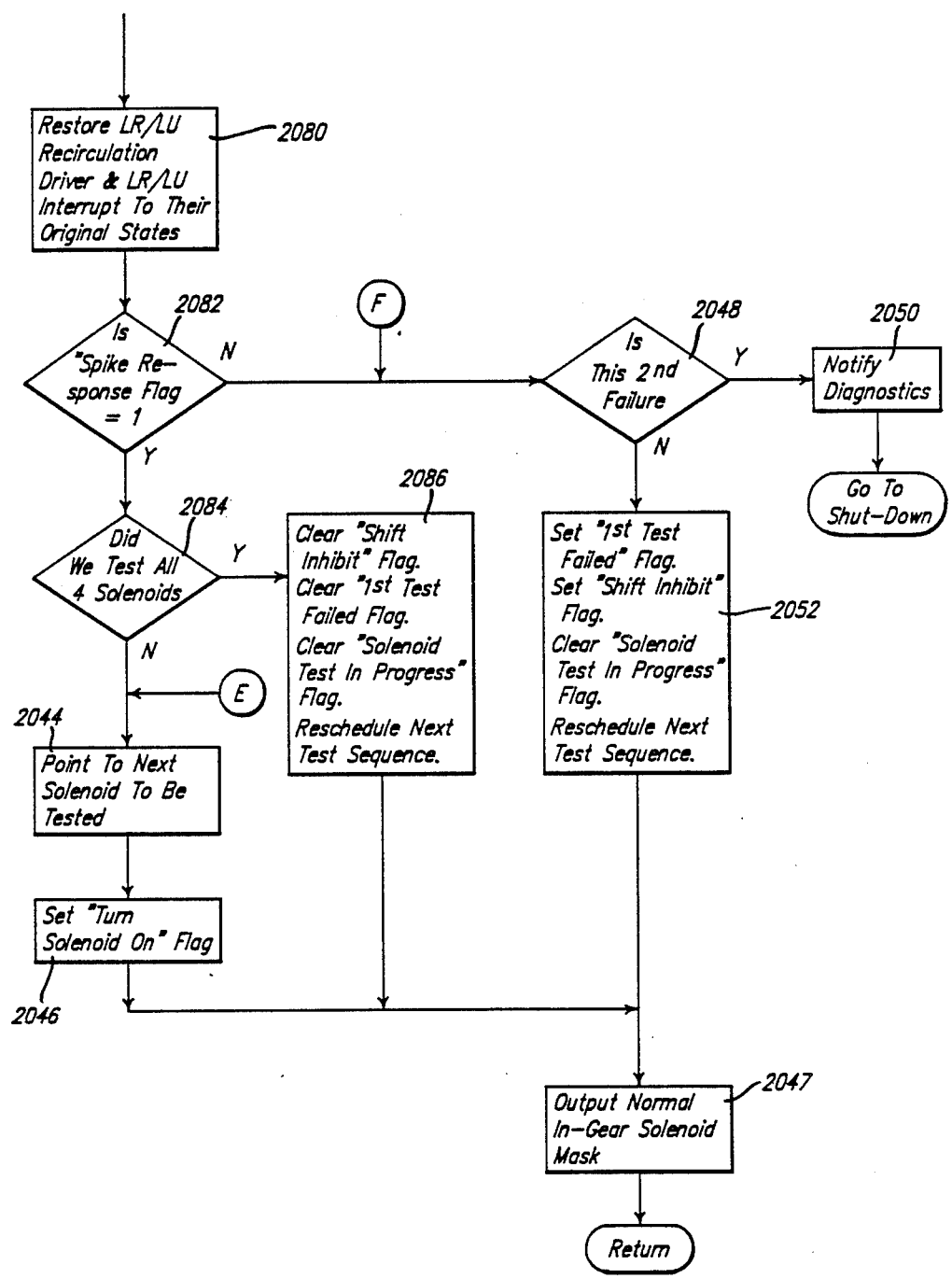
Figure 22E:
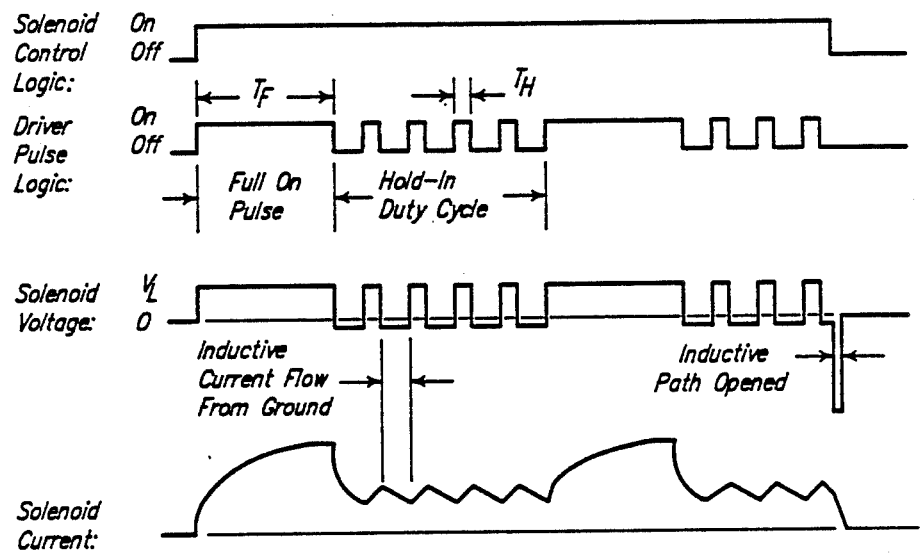

The purpose of the driver circuit continuity test is to check the solenoid circuitry for proper operation. Since the solenoid driver controls the ground side of each solenoid coil 710 (FIG. 8), a direct short to ground in the line from the solenoid of the solenoid-actuated valves 630, 632, 634 and 636 to the transmission controller 3010 would energize the solenoid coil 710 at a power level that can result in permanent coil damage from overheating. An open circuit (or direct short to supply voltage) would also prevent turning the solenoid-actuated valves "ON". Since these failures result in a loss of the normal inductive "OFF" spike (See FIG. 22E), a test which checks for the presence of this spike is used to confirm circuit continuity.

The transmission controller 3010 of the present invention uses one spike monitor circuit to test all the solenoids of the solenoid-actuated valves 630, 632, 634 and 636. The transmission controller 3010 uses a unique scheduling method or routine to ensure that the response of the spike monitor circuit is from the appropriate solenoid as shown by the blocks and diamonds enclosed by the dashed line of FIGS. 22B and 22C. When the torque converter 110 is either in unlock or pullback, no solenoids are under duty cycle control. The solenoids of the solenoid-actuated valves are tested sequentially to guarantee the spike monitor circuit response is from the appropriate solenoid.

When the torque converter 110 is in partial lock-up, the low/reverse clutch solenoid-actuated valve 636 is under duty cycle (interrupt) control. The low/reverse clutch solenoid-actuated valve 636 is tested by looking for the spike monitor circuit response caused by normal turn OFF (de-energizing) via the interrupt control. The remaining solenoids are then tested in sequence.

If the low/reverse clutch solenoid is ON (energized), a low/reverse interrupt is disabled to guarantee the spike monitor circuit response is from the solenoid under test and not from the low/reverse solenoid which is under interrupt control. If the low/reverse clutch solenoid is OFF, a low/reverse recirculation driver is turned ON to make sure the spike monitor circuit has recovered from the spike caused by the last turn OFF of the low/reverse clutch solenoid via the interrupt. This method or technique guarantees that the response of the spike monitor circuit is from the appropriate solenoid.

Referring to FIGS. 22A through 22D, the methodology for the solenoid continuity test is shown. At the beginning, in bubble 2000, the methodology advances to diamond 2002 and determines whether the solenoid continuity test is in progress by looking for a flag. If the solenoid continuity test is not in progress, the methodology advances to diamond 2004 and determines whether it is time to run the solenoid continuity test by looking for a flag for example. If it is not time to run the solenoid continuity test, the methodology returns. If it is time to run the solenoid continuity test, the methodology advances to diamond 2006 and determines whether a shift is in progress by looking for a flag. If a shift is in progress, the methodology returns. If a shift is not in progress, the methodology advances to diamond 2008 and determines whether the shift lever position (SLP) test, previously described, is in progress by looking for a flag. If the SLP test is in progress, the methodology returns. If the SLP test is not in progress, the methodology advances to diamond 2010 and determines whether the pressure switch (P/SW) test, previously described, is in progress by looking for a flag. If the P/SW test is in progress, the methodology returns. If the P/SW test is not in progress, the methodology advances to block 2012 and sets a "solenoid test in progress flag", "turn solenoid ON" flag, and a "low/reverse LR solenoid under test" flag and returns. The above methodology is used because a solenoid continuity test sequence cannot occur while a shift, shift lever position test or pressure switch test is in progress.

At diamond 2002, the transmission controller 3010 determines whether the solenoid continuity test is in progress as previously described. If the solenoid continuity test is in progress, the methodology advances to diamond 2014 and determines whether a SLP test is in progress as previously described. If a shift lever position test in progress, the methodology advances to block 2016 and aborts the test sequence by clearing the "solenoid test in progress" flag and advances to block 2018. At block 2018, the transmission controller 3010 outputs the normal in-gear solenoid mask (i.e. logical states) to the solenoid-actuated valves and returns. If the SLP test is not in progress at diamond 2014, the methodology advances to diamond 2020 and determines whether a shift is in progress as previously described. If a shift is in progress, the methodology advances to block 2016 previously described. The above methodology is used to interrupt the test sequence for a shift lever position test or a shift in progress.

If a shift is not in progress, the methodology advances to diamond 2022 and determines whether the low/reverse solenoid-actuated valve 636 is under test by looking for a flag for example. In the test sequence, each solenoid-actuated valve must be tested separately to ensure that the response is from the appropriate solenoid. Therefore, if the low/reverse solenoid-actuated valve 636 is not under test, the methodology advances to diamond 2024 and determines whether it is time to turn ON the solenoid under test by looking for a flag for example. If it is time to turn ON the solenoid under test, the methodology advances to block 2026 and turns ON the solenoid under test, clears the "turn solenoid ON" flag, and clears the "in partial lock-up (PL) last loop" flag and returns. If it is not time to turn ON the solenoid under test, the methodology advances to diamond 2054 to be described.

At diamond 2022, the transmission controller 3010 determines whether the low/reverse solenoid-actuated valve 636 is under test by looking for a flag for example. If the low/reverse solenoid-actuated valve 636 is under test, the methodology advances to diamond 2028 and determines whether partial lock-up of the torque converter 110 is in progress by looking for a flag. If partial lock-up is not in progress, the methodology advances to diamond 2024 previously described. If partial lock-up is in progress, the methodology advances to diamond 2030 and determines whether it is time to turn ON the solenoid-actuated valve under test as previously described. If it is time to turn ON the solenoid-actuated valve under test, the methodology advances to diamond 2031 and determines whether the methodology is at the start of a partial lock-up period, previously described (FIG. 18B), by looking for a flag for example. If the methodology is at the start of a partial lock-up period, the methodology returns. If the methodology is not at the start of a partial lock-up period, the methodology advances to block 2032 and clears a "spike monitor edge detect" flag, a "spike response" flag, a "turn ON solenoid" flag, and "first partial lock-up period has elapsed" flag. The methodology then advances to block 2033 and sets a "in partial lock-up last loop" flag. The methodology then returns.

At diamond 2030, if it is not time to turn ON the solenoid-actuated valve under test, the methodology advances to diamond 2034 and determines whether partial lock-up of the torque converter 110 occurred in the last loop by looking for a flag. If partial lock-up did not occur in the last loop, the methodology advances to block 2035 and sets the "turn ON solenoid" flag. The methodology then advances to block 2036 and outputs a normal in-gear solenoid mask as previously described. The methodology then returns.

If partial lock-up occurred in the last loop at diamond 2034, the methodology advances to diamond 2037 and determines whether a "spike response" previously described was received from the low/reverse interrupt. If a spike response was not received, the methodology advances to diamond 2038 and determines whether the partial lock-up period has expired by looking for a flag for example. If the period has not expired, the methodology advances to block 2036 previously described. If the period has expired, the methodology advances to diamond 2040 and determines whether the "first partial lock-up period has elapsed flag" has been set. If the flag has not been set, the methodology advances to block 2042 and sets the "first partial lock-up period has elapsed" flag. The methodology then advances to block 2036 previously described. If the flag has been set, the methodology advances to diamond 2048 to be described herein.

At diamond 2037, if a spike response was not received, the methodology advances to block 2044 and points to the next solenoid-actuated valve to be tested. The methodology then advances to block 2046 and sets the "turn solenoid ON" flag. The methodology then advances to block 2047 and outputs the normal in-gear solenoid mask for the solenoid-actuated valves as previously described. The methodology then returns.

At diamond 2040, if the "first partial lock-up period has elapsed flag" has been set, the methodology advances to diamond 2048 and determines whether a second failure has occurred by looking for a flag for example. If a second failure has occurred, the methodology advances to block 2050 and notifies the diagnostics, to be described, of the transmission controller 3010 and advances to shut down mode. If a second failure has not occurred, the methodology advances to block 2052 and sets a "first test failed" flag, sets a "shift inhibit" flag, clears the "solenoid test in progress" flag, and reschedules the next test sequence, in a predetermined time period, i.e. 2 seconds. The methodology then advances to block 2047 previously described.

At diamond 2054, the transmission controller 3010 determines whether the low/reverse solenoid-actuated valve 636 is under test as previously described. If the low/reverse solenoid-actuated valve 636 is under test, the methodology advances to diamond 2056 and determines whether partial lock-up of the torque converter 110 occurred in the last loop by looking for a flag. If partial lock-up occurred in the last loop, the methodology advances to block 2058 and sets the "turn solenoid ON" flag. The methodology advances to block 2059 and outputs the normal in-gear solenoid mask as previously described and returns.

If the low/reverse solenoid-actuated valve 636 is not under test or partial lock-up did not occur in the last loop, the methodology advances to diamond 2060 and determines whether the low/reverse solenoid-actuated valve 636 is ON as previously described. If the low/reverse solenoid-actuated valve 636 is not ON, the methodology advances to block 2062 and turns ON the LR/LU recirculation driver to guarantee that the spike monitor circuit has recovered. The methodology advances to block 2064 and delays for a predetermined time period ($T_2$). The methodology then advances to block 2068 to be described herein.

At diamond 2060, if the low/reverse solenoid-actuated valve 636 is ON, the methodology advances to diamond 2065 and determines whether the LR/LU interrupt is enabled by looking for a flag for example. If the LR/LU interrupt is enabled, the methodology advances to block 2066 and disables the LR/LU interrupt. The methodology then advances to block 2068. If the LR/LU interrupt is not enabled, the methodology advances to diamond 2068 and clears the "spike monitor edge detect" flag. The methodology then advances to block 2070 and turns OFF the solenoid-actuated valve under test. The methodology then advances to diamond 2072 and determines whether the spike monitor circuit has responded by looking for a back EMF spike when the solenoid is turned OFF. If the spike monitor circuit has responded, the methodology advances to block 2074 and sets a "spike response" flag. If the spike monitor circuit has not responded, the methodology advances to diamond 2076 and determines whether the predetermined time period ($T_2$) has expired by looking at a timer for example. If the predetermined time period has not expired, the methodology loops back to diamond 2072 previously described. If the predetermined time period has expired, the methodology advances to block 2078 and clears the "spike response" flag.

From blocks 2074 and 2078, the methodology advances to block 2080 and restores the LR/LU recirculation driver and LR/LU interrupt to their original state. The methodology then advances to diamond 2082 and determines whether the "spike response" flag has previously been set. If the spike response flag has not been set, the methodology advances to diamond 2048 previously described. If the spike response flag has been set, the methodology advances to diamond 2084 and determines whether all four solenoid-actuated valves 630, 632, 634 and 636 have been tested by looking to see if four spikes have been received. If all four solenoid-actuated valves have been tested, the methodology advances to block 2086. At block 2086, the transmission controller 3010 clears the "shift inhibit" flag, clears the "first test failed" flag, clears the "solenoid in progress" flag, and reschedules the next test sequence in a predetermined time period such as 10 seconds. The methodology advances to block 2047 previously described.

The present invention has been described in an illustrative manner. It is to be understood that the terminology which has been used is intended to be in the nature of words of description rather than of limitation.

Obviously, many modifications and variations are possible in light of the above teachings. Therefore, the subject invention may be practiced otherwise than as specifically described.

What is claimed is:

1. In a vehicle transmission including an input member, an output member, a torque converter assembly for transmitting torque between an engine and the input member, a gear assembly for changing the ratio of torque between the input member and output member, a plurality of frictional units to shift the gear assembly, at least one solenoid-actuated valve being actuated in response to the presence or absence of electrical power to the valve for directing fluid flow between a fluid source and at least one of the frictional units, input sensors providing input signals of predetermined conditions, a controller for processing the input signals and providing output signals to control the solenoid-actuated valves, a method of determining the electrical continuity of solenoids for solenoid-actuated valves in the vehicle transmission, said method comprising the steps of:

determining whether a solenoid test to determine the continuity of a plurality of solenoids is in progress by looking for a flag;

determining whether it is time to execute the solenoid test by comparing the time on a timer to a predetermined time if the solenoid test is not in progress;

determining whether a shift of the gear assembly is in progress by looking for a flag if it is time to execute the solenoid test;

determining whether a shift lever position test to determine the position of a driver-selected operating mode of the transmission is in progress by looking for a flag if a shift is not in progress;

determining whether a pressure switch test to determine the proper operation of the pressure switches is in progress by looking for a flag if the shift lever position test is not in progress; and setting a plurality of predetermined flags if the pressure switch test is not in progress.

2. A method as set forth in claim 1 including the steps of:

determining whether a shift lever position test is in progress by looking for a flag if the solenoid test is in progress;

determining whether a shift is in progress if a shift lever position test is not in progress;

aborting the solenoid test by clearing the solenoid test in progress flag if either one of a shift lever position test and a shift is in progress; and outputting a normal in-gear solenoid mast to the solenoids of the solenoid-actuated valves.

3. A method as set forth in claim 2 including the steps of:

determining whether a predetermined solenoid is under test by looking for a flag if a shift is not in progress;

determining whether a torque converter is the transmission is being partially locked to the engine by looking for a flag if a solenoid is under test;

determining whether it is time for the solenoid to be turned on;

determining whether it is time for the solenoid to be turned on if the torque converter was being partially locked;

determining whether the method is at the start of a partial lockup period for the torque converter if the solenoid is to be turned on;

clearing the predetermined flags; and setting a predetermined flag for partial lock-up of the torque converter.

4. A method as set forth in claim 3 including the steps of:

determining whether it is time for the solenoid to be turned on if the torque converter was not being partially locked;

turning on the solenoid under test; and clearing the predetermined flags.

5. A method as set forth in claim 4 including the steps of:

determining whether a predetermined solenoid is under test if it is time to turn the solenoid on;

determining whether the method is in the last loop of partial lock-up of the torque converter if the predetermined solenoid is under test;

setting a predetermined flag; and outputting a normal in-gear solenoid mast to the solenoid-actuated valves.

6. A method as set forth in claim 5 including the steps of:

determining whether a predetermined solenoid is on;

turning on a recirculation driver to guarantee that a spike monitor circuit has recovered;

delaying for a predetermined time;

determining whether an interrupt was enabled if the predetermined solenoid is on;

disabling the interrupt if the interrupt is enabled;

clearing a predetermined flag if the interrupt is not enabled and after delaying for the predetermined time;

turning off the predetermined solenoid under test;

determining whether the spike monitor circuit has responded;

determining whether the predetermined time has expired if the spike monitor circuit has not responded;

setting a predetermined flag if the spike monitor circuit has responded;

clearing a predetermined flag if the predetermined time period has expired restoring the recirculation driver and interrupt to their original states;

determining whether a predetermined flag has been set;

determining whether all of the solenoids of the solenoid-actuated valves were tested if the predetermined flag was set;

pointing to the next solenoid to be tested;

setting a predetermined flag; and outputting a normal in-gear solenoid mast to the solenoid-actuated valves.

7. A method as set forth in claim 6 including the steps of:

clearing a plurality of predetermined flags and scheduling a next test sequence if all the solenoids of the solenoid-actuated valves were tested; and outputting a normal in-gear solenoid mast to the solenoid-actuated valves.

8. A method as set forth in claim 3 including the steps of:

determining whether the method is at the start of a partial lock-up for the torque converter if the solenoid is to be turned on;

setting a turn on solenoid flag if the method is not at the start of a partial lock-up period for the torque converter; and outputting a normal in-gear solenoid mast to the solenoid actuated valves.

9. A method as set forth in claim 3 including the steps of:

determining whether a spike response was received by the controller if the method is at the start of a partial lock-up period for the torque converter;

determining whether the partial lock-up period has expired if a spike was not received; and outputting a normal in-gear solenoid mast to the solenoid-actuated valves.

10. A method as set forth in claim 9 including the steps of:

determining whether a partial lock-up period elapsed flag has been set if the partial lock-up period has not expired; and setting the partial lock-up elapsed flag if the partial lock-up elapsed flag has not been set.

11. A method as set forth in claim 10 including the steps of:

determining whether a second failure has occurred if the partial elapsed flag has been set; and notifying the diagnostics if a second failure has occurred.

12. A method as set forth in claim 11 including the steps of:

setting predetermined flags if a second failure has not occurred;

clearing predetermined flag;

rescheduling the next test sequence; and outputting a normal in-gear solenoid mast to the solenoid-actuated valves.

13. A method as set forth in claim 12 including the steps of:

pointing to the next solenoid to be tested if a spike was received by the controller;

setting a predetermined flag; and
outputting a normal in-gear solenoid mast to the solenoid-actuated valves.

14. In a vehicle transmission including an input member, an output member, a torque converter assembly for transmitting torque between an engine and the input member, a gear assembly for changing the ratio of torque between the input member and output member, a plurality of frictional units to shift the gear assembly, at least one solenoid-actuated valve being actuated in response to the presence or absence of electrical power to the valve for directing fluid flow between a fluid source and at least one of the frictional units, input sensors providing input signals of predetermined conditions, a controller for processing the input signals and providing output signals to control the solenoid-actuated valves, a method of determining the electrical continuity of solenoids for solenoid-actuated valves in the vehicle transmission, said method comprising the steps of;

determining whether a solenoid test to determine the continuity of a plurality of solenoids is in progress by looking for a flag;

determining whether it is time to execute the solenoid test by comparing the time on a timer to a predetermined time if the solenoid test is not in progress;

determining whether a shift of the gear assembly is in progress by looking for a flag if it is time to execute the solenoid test;

determining whether a shift lever position test to determine the position of a driver-selected operating mode of the transmission is in progress by looking for a flag if a shift is not in progress;

determining whether a pressure switch test to determine the proper operation of the pressure switches is in progress by looking for a flag if the shift lever position test is not in progress;

setting a plurality of predetermined flags if the pressure switch test is not in progress;

determining whether a shift lever position test is in progress by looking for a flag if the solenoid test is in progress;

determining whether a shift is in progress if a shift lever position test is not in progress;

aborting the solenoid test by clearing the solenoid test in progress flag if either one of a shift lever position test and a shift is in progress;

outputting a normal in-gear solenoid mast to the solenoids of the solenoid-actuated valves;

determining whether a predetermined solenoid is under test by looking for a flag if a shift is not in progress;

determining whether a torque converter in the transmission is being partially locked to the engine by looking for a flag if a solenoid is under test;

determining whether it is time for the solenoid to be turned on;

determining whether it is time for the solenoid to be turned on if the torque converter was being partially locked;

determining whether the method is at the start of a partial lockup period for the torque converter if the solenoid is to be turned on;

clearing the predetermined flags;

setting a predetermined flag for partial lock-up of the torque converter;

determining whether it is time for the solenoid to be turned on if the torque converter was not being partially locked;

turning on the solenoid under test;

clearing the predetermined flags determining whether the method is at the start of a partial lock-up period for the torque converter if the solenoid is to be turned on;

setting a turn on solenoid flag if the method is not at the start of a partial lock-up period for the torque converter;

outputting a normal in-gear solenoid mast to the solenoid actuated valves;

determining whether a spike response was received by the controller if the method is at the start of a partial lock-up period for the torque converter;

determining whether the partial lock-up period has expired if a spike was not received;

outputting a normal in-gear solenoid mast to the solenoid-actuated valves;

determining whether a partial lock-up period elapsed flag has been set if the partial lock-up period has not expired;

setting the partial lock-up elapsed flag if the partial lock-up elapsed flag has not been set;

determining whether a second failure has occurred if the partial elapsed flag has been set;

notifying the diagnostics if a second failure has occurred;

setting predetermined flags if a second failure has not occurred;

clearing predetermined flag;

rescheduling the next test sequence;

outputting a normal in-gear solenoid mast to the solenoid-actuated valves;

pointing to the next solenoid to be tested if a spike was received by the controller;

setting a predetermined flag;

outputting a normal in-gear solenoid mast to the solenoid-actuated valves;

determining whether a predetermined solenoid is under test if it is time to turn the solenoid on;

determining whether the method is in the last loop of partial lock-up of the torque converter if the predetermined solenoid is under test;

setting a predetermined flag;

outputting a normal in-gear solenoid mast to the solenoid-actuated valves;

determining whether a predetermined solenoid is on;

turning on a recirculation driver to guarantee that the spike monitor circuit has recovered;

delaying for a predetermined time;

determining whether an interrupt was enabled if the predetermined solenoid is on;

disabling the interrupt if the interrupt is enabled;

clearing a predetermined flag if the interrupt is not enabled and after delaying for the predetermined time;

turning off the predetermined solenoid under test;

determining whether a spike monitor circuit has responded;

determining whether the predetermined time has expired if the spike monitor has not responded;

setting a predetermined flag if the spike monitor circuit has responded;

clearing a predetermined flag if the predetermined time period has expired restoring the recirculation driver and interrupt to their original states;

determining whether a predetermined flag has been set;
determining whether all of the solenoids of the solenoid-actuated valves were tested if the predetermined flag was set;
pointing to the next solenoid to be tested;
setting a predetermined flag; and
outputting a normal in-gear solenoid mast to the solenoid-actuated valves.

15. In a vehicle transmission including an input member, an output member, a torque converter assembly for transmitting torque between an engine and the input member, a gear assembly for changing the ratio of torque between the input member and output member, a plurality of frictional units to shift the gear assembly, at least one solenoid-actuated valve being actuated in response to the presence or absence of electrical power to the valve for directing fluid flow between a fluid source and at least one of the frictional units, input sensors providing input signals of predetermined conditions, a controller for processing the input signals and providing output signals to control the solenoid-actuated valves, a method of determining the electrical continuity of solenoids for solenoid-actuated valves in the vehicle transmission, said method comprising the steps of;
checking whether at least one predetermined event is occurring;
executing a solenoid test to determine the continuity of a plurality of solenoids based on the at least one predetermined event;
determining whether a predetermined solenoid is under test;
checking whether a torque converter in the transmission is being partially locked to the engine if a solenoid is under test;
turning on the solenoid under test if the method is at the start of a partial lockup period for the torque converter;
turning off the predetermined solenoid under test;
determining whether a spike response was received by the controller;
pointing to the next solenoid to be tested if a spike response was received by the controller;
determining whether all of the solenoids of the solenoid-actuated valves were tested; and
ending the test if all of the solenoids of the solenoid-actuated valves were tested, otherwise continuing the test for the next solenoid to be tested.

16. In a vehicle transmission including an input member, an output member, a gear assembly for changing the ratio of torque between the input member and the output member, a plurality of friction elements to shift the gear assembly, at least one solenoid-actuated valve having predetermined operating states (ON and OFF) and being actuated in response to the presence or absence of electrical power to the valve for directing fluid flow between a fluid source and at least one of the friction elements, input sensors providing input signals indicative of predetermined conditions, a controller having memory for processing and storing the input signals and predetermined values and providing output signals to control the solenoid-actuated valves, a method of determining the electrical continuity of solenoids for solenoid-actuated valves in a vehicle transmission, said method comprising the steps of;
checking whether there are any test inhibits which prevent the test from being performed;
if there are any test inhibits, ending the test;
if there are not any inhibits, continuing the test;
turning each solenoid of the solenoid-actuated valves ON if not already ON;
turning each solenoid of the solenoid-actuated valves OFF;
monitoring a driver circuit for an inductive OFF spike to determine if the spike is present;
if the spike is present for each solenoid of the solenoid-actuated valves, ending the test; and
if the spike is not present for each of the solenoid-actuated valves, reporting to the diagnostics.

* * * * *